US011921069B1

(12) United States Patent
Vinegar et al.

(10) Patent No.: US 11,921,069 B1
(45) Date of Patent: Mar. 5, 2024

(54) DETERMINATION OF FLUID-PHASE-SPECIFIC PETROPHYSICAL PROPERTIES OF GEOLOGICAL CORE FOR OIL, WATER AND GAS PHASES

(71) Applicants: Vinegar Technologies LLC, Bellaire, TX (US); William Marsh Rice University, Houston, TX (US)

(72) Inventors: Eva Vinegar, Bellaire, TX (US); Philip M. Singer, Richmond, TX (US); George J. Hirasaki, Bellaire, TX (US); Zeliang Chen, Houston, TX (US); Xinglin Wang, Houston, TX (US); Harold J. Vinegar, Bellaire, TX (US)

(73) Assignee: Vinegar Technologies LLC, West Lake Hills, TX (US)

( * ) Notice: Subject to any disclaimer, the term of this patent is extended or adjusted under 35 U.S.C. 154(b) by 201 days.

(21) Appl. No.: 17/224,093

(22) Filed: Apr. 6, 2021

Related U.S. Application Data

(60) Provisional application No. 63/005,482, filed on Apr. 6, 2020.

(51) Int. Cl.
*G01N 24/08* (2006.01)
*E21B 7/04* (2006.01)
(Continued)

(52) U.S. Cl.
CPC ........... *G01N 24/081* (2013.01); *E21B 7/046* (2013.01); *G01N 15/088* (2013.01); *G01N 24/082* (2013.01); *E21B 49/02* (2013.01)

(58) Field of Classification Search
CPC .. G01N 24/081; G01N 15/088; G01N 24/082; E21B 7/046; E21B 49/02
See application file for complete search history.

(56) References Cited

U.S. PATENT DOCUMENTS

2012/0092007 A1\* 4/2012 Li ................. G01N 24/081
324/306
2015/0153433 A1\* 6/2015 Paulsen ............. G01N 24/081
324/309
(Continued)

FOREIGN PATENT DOCUMENTS

GB          2542406 A  \*  3/2017  .......... G01N 15/088
WO  WO-2012123863 A2  \*  9/2012  .......... G01N 24/081
WO  WO-2017151928 A1  \*  9/2017  ......... E21B 47/0002

OTHER PUBLICATIONS

Hirasaki, G. J., Rohan, J. A., and J. W. Dudley. "Interpretation of Oil-Water Relative Permeabilities from Centrifuge Experiments." SPE Advanced Technology Series 3 (1995): 66-75. doi: https://doi.org/10.2118/24879-PA (Year: 1995).\*
(Continued)

*Primary Examiner* — Michael J Logie
*Assistant Examiner* — Christopher J Gassen
(74) *Attorney, Agent, or Firm* — Momentum IP; Marc Van Dyke

(57) ABSTRACT

The following invention is used for determining the relative permeability of a fluid in a rock for three different phases: water, oil, and gas, in both conventional and unconventional formations. The permeability of a phase describes how much it can flow in porous media given a pressure gradient and is useful in evaluating reservoir quality and productivity. The following invention is a method to determine the three-phase relative permeabilities in both conventional and unconventional formations using NMR restricted diffusion measurements on core with NMR-active nuclei, combined with centrifugation of the core. In addition, the tortuosity, pore size (surface-to-volume ratio), fluid-filled porosity, and permeability is determined for each of the three phases in a rock.

13 Claims, 9 Drawing Sheets

(51) Int. Cl.
    G01N 15/08    (2006.01)
    E21B 49/02    (2006.01)

(56) References Cited

U.S. PATENT DOCUMENTS

| | | | |
|---|---|---|---|
| 2015/0168588 A1* | 6/2015 | Vinegar | G01V 3/38 |
| | | | 702/7 |
| 2015/0184500 A1 | 7/2015 | Vinegar et al. | |
| 2015/0210917 A1 | 7/2015 | Vinegar et al. | |
| 2015/0329785 A1 | 11/2015 | Vinegar et al. | |
| 2021/0285902 A1* | 9/2021 | Elsayed | G01V 3/32 |

OTHER PUBLICATIONS

Tinni, A.., Odusina, E.., Sulucarnain, I.., Sondergeld, C.., and C. S. Rai. "Nuclear-Magnetic-Resonance Response of Brine, Oil, and Methane in Organic-Rich Shales." SPE Res Eval & Eng 18 (2015): 400-406. doi: https://doi.org/10.2118/168971-PA (Year: 2015).*

Saraf, D.N., and I. Fatt. "Three-Phase Relative Permeability Measurement Using a Nuclear Magnetic Resonance Technique for Estimating Fluid Saturation." SPE J. 7 (1967): 235-242. doi: https://doi.org/10.2118/1760-PA (Year: 1967).*

Chen, Z.; Singer, P. M.; Jun, K.; Vargas, F. P.; Hirasaki, G. J.; Jun, K.; Vargas, F. P.; Hirasaki, G. J. Effects of Bitumen Extraction on the 2D NMR Response of Saturated Kerogen Isolates. Petrophysics 2017, 58, 470-484.

Fleury, M.; Romero-Sarmiento, M. Characterization of Shales Using T1-T2 NMR Maps. Journal of Petroleum Science and Engineering 2016, 137, 55-62.

Chen, Z., Singer, P.M., Wang, X., Hirasaki, G.J., Vinegar, H.J., 2019: Evaluation of Light Hydrocarbon Composition, Pore Size, and Tortuosity in Organic-Rich Chalks using NMR Core Analysis and Logging, Society of Petrophysicists and Well-Log Analysts, SPWLA-2019-K.

Archie, G. E., 2003: The Electrical Resistivity Log as an Aid in Determining Some Reservoir Characteristics. SPE Reprint Series, 146, 9-16.

Krynicki, K.; Green, C. D.; Sawyer, D. W. Pressure and Temperature Dependence of Self-Diffusion in Water. Faraday Discussions of the Chemical Society 1978, 66, 199-208.

Latour, L. L.; Mitra, P. P.; Kleinberg, R. L.; Sotak, C. H. Time-Dependent Diffusion Coefficient of Fluids in Porous Media as a Probe of Surface-to-Volume Ratio. Journal of Magnetic Resonance, Series A 1993, 101, 342-346.

Lo, S.-W.; Hirasaki, G. J.; House, W. V.; Kobayashi, R. Mixing Rules and Correlations of NMR Relaxation Time with Viscosity, Diffusivity, and Gas/Oil Ratio of Methane/Hydrocarbon Mixtures. Society of Petroleum Engineers (SPE) Journal 2002, 7, 1-4.

Minh, C. C.; Crary, S.; Singer, P. M.; Valori, A.; Bachman, N.; Hursan, G. G.; Ma, S. M.; Belowi, A.; Kraishan, G. Determination of Wettability from Magnetic Resonance Relaxation and Diffusion Measurements on Fresh-State Cores. SPWLA 56th Annual Logging Symposium 2015.

Mitchell, J.; Gladden, L. F.; Chandrasekera, T. C.; Fordham, E. J. Low-Field Permanent Magnets for Industrial Process and Quality Control. Progress in Nuclear Magnetic Resonance Spectroscopy 2014, 76, 1-60.

Wang, H. J.; Mutina, A.; Kausik, R. High-field Nuclear Magnetic Resonance Observation of Gas Shale Fracturing by Methane Gas. Energy & Fuels 2014, 28, 3638-3644.

Yang, Z.; Hirasaki, G. J.; Appel, M.; Reed, D. A. Viscosity Evaluation for NMR Well Logging of Live Heavy Oils. Petrophysics 2012, 53, 22-37.

Oosting, P. H.; Trappeniers, N. J. Proton Spin-Lattice Relaxation and Self-Diffusion in Methanes. IV. Self-diffusion in methane. Physica 1971, 51, 418-431.

Singer, P. M.; Chen, Z.; Hirasaki, G. J. Fluid Typing and Pore Size in Organic Shale using 2D NMR in Saturated Kerogen. Petrophysics 2016, 57, 604-619.

Cotts, R.M., Hoch, M.J.R., Sun, T., Markert, J.T.; 1989: Pulsed Field Gradient Stimulated Echo Methods for Improved NMR Diffusion Measurements in Heterogeneous Systems. J. Magn. Reason. 83(2), 252-266.

Singer, P. M.; Asthagiri, D.; Chapman, W. G.; Hirasaki, G. J. Molecular Dynamics Simulations of NMR Relaxation and Diffusion of Bulk Hydrocarbons and Water. Journal of Magnetic Resonance 2017, 277, 15-24.

Singer, P. M.; Chen, Z.; Alemany, L. B.; Hirasaki, G. J.; Zhu, K.; Xie, Z. H.; Vo, T. D. Interpretation of NMR Relaxation In Bitumen and Organic Shale Using Polymer-Heptane Mixes. Energy & Fuels 2018, 32, 1534-1549.

Singer, P. M.; Asthagiri, D.; Chapman, W. G.; Hirasaki, G. J. NMR Spin-Rotation Relaxation and Diffusion of Methane. The Journal of Chemical Physics 2018, 148.

Singer, P. M.; Asthagiri, D.; Chen, Z.; Valiya Parambathu, A.; Hirasaki, G. J.; Chapman, W. G. Role of Internal Motions and Molecular Geometry on the NMR Relaxation of Hydrocarbons. Journal of Chemical Physics 2018, 148.

Chang, D., Vinegar, H.J., Morriss, C., Straley, C., 1994: Effective Porosity, Producible Fluid and Permeability in Carbonates from NMR Logging, Society of Petrophysicists and Well-Log Analysts, SPWLA-1994-A.

Valori, A.; Van Den Berg, S.; Ali, F.; Abdallah, W. Permeability Estimation from NMR Time Dependent Methane Saturation Monitoring in Shales. Energy & Fuels 2017, 31, 5913-5925.

Venkataramanan, L.; Song, Y.; Hurlimann, M. D. Solving Fredholm Integrals of the First Kind with Tensor Product Structure in 2 and 2.5 Dimensions. IEEE Transaction on Signal Processing 2002, 50 (5), 1017-1026.

Zielinski, L.; Ramamoorthy, R.; Minh, C. C.; Al Daghar, K. A.; Sayed, R. H.; Abdelaal, A. F., 2010: Restricted Diffusion Effects in Saturation Estimates From 2D Diffusion-Relaxation NMR Maps. Society of Petroleum Engineers.

Wang, X., Singer, P.M., Chen, Z., Hirasaki, G.J., Vinegar, H.J., 2020: A New Method of Estimating Tortuosity and Pore Size in Unconventional Formations using NMR Restricted Diffusion Measurements, Society of Petrophysicists and Well-Log Analysts.

Wyllie, M. R. J.; Rose, W. D., 1950: Some Theoretical Considerations Related to The Quantitative Evaluation of The Physical Characteristics of Reservoir Rock From Electrical Log Data, Journal of Petroleum Technology., 2, 105-118.

Chen, Z., Singer, P.M., Wang, X., Vinegar, H.J., Nguyen, S.V., Hirasaki, G.J., 2019: NMR Evaluation of Light-Hydrocarbon Composition, Pore Size, and Tortuosity in Organic-Rich Chalks, Petrophysics 60 (06), 771-797.

Webber, J.B.W., 2010 Studies of Nano-Structured Liquids in Confined Geometries and at Surfaces, Progress in Nuclear Magnetic Resonance Spectroscopy 56 78-93.

Timur, R., , 1969: Pulsed Nuclear Magnetic Resonance Studies of Porosity, Movable Fluid, and Permeability of Sandstones, Society Petroleum Engineers, SPE-2045-PA.

Yang, K.; Li, M.; Ling, N. N. A.; May, E. F.; Connolly, P. R. J.; Esteban, L.; Clennell, M. B.; Mahmoud, M.; El-Husseiny, A.; Adebayo, A. R.; Elsayed, M. M.; Johns, M. L., 2019: Quantitative Tortuosity Measurements of Carbonate Rocks Using Pulsed Field Gradient NMR, Transport in Porous Media., 130, 847-865.

Zecca, M.; Vogt, S. J.; Connolly, P. R. J.; May, E. F.; Johns, M. L., 2018: NMR Measurements of Tortuosity in Partially Saturated Porous Media. Transport in Porous Media., 125, 271-288.

Tofts, P.S., Lloyd, D., Clark, C.A., Barker, G.J., Parker, G.J.M., McConville, P., Baldock, C., Pope, J.M., 2000 Test Liquids for Quantitative MRI Measurements of Self-Diffusion Coefficient In Vivo, Magn. Reson. Med. 43, 368-374.

Muller-Huber, E., Schon, J., Borner, F., 2016 A Pore Body-Pore Throat-Based Capillary Approach for NMR Interpretation in Carbonate Rocks using the Coates Equation, Society of Petrophysicists and Well-Log Analysts.

Sander, R.; Pan, Z.; Connell, L. D., 2017: Laboratory Measurement of Low Permeability Unconventional Gas Reservoir Rocks: A Review of Experimental Methods. Journal of Natural Gas Science and Engineering., 37, 248-279.

(56) References Cited

OTHER PUBLICATIONS

Swanson, B. F., 1981: A Simple Correlation Between Permeabilities and Mercury Capillary Pressures. Society of Petroleum Engineers. Journal of Petroleum Technology., 33, 2498-2504.

Tanner, J. E., 1970: Use of the Stimulated Echo in NMR Diffusion Studies. The Journal of Chemical Physics., 52, 2523-2526.

Souza, A., Carneiro, G., Zielinski, L., Polinski, R., Schwartz, L., Hürlimann, M.D., Boyd, A., Rios, E.H., Camilo dos Santos, B.C., Trevizan, W.A., Machado, F.V., Azeredo, R.B.V., 2013: Permeability Prediction Improvement using 2D NMR Diffusion-T2 Maps, Society of Petrophysicists and Well-Log Analysts, SPWLA-2013-U.

Straley, C., Rossini, D., Vinegar, H.J., Tutunjian, P., Morriss, C., 1997: Core Analysis by Low-Field NMR, Society of Petrophysicists and Well-Log Analysts, SPWLA-1997-v38n2a3.

Vinegar, E. G.; Rosenberg, Y. O.; Reznick, I.; Gordin, Y.; Singer, Philip M. S.; Wang, X.; Chen, Z.; Nguyen, S. V.; Li, W.; Bradley, T.; Hirasaki, G. J.; Lake, L. W.; Feinstein, S.; Hatzor, Y. H.; Vinegar, H. J., 2020. What Happens to the Petrophysical Properties of a Dual-Porosity Organic-Rich Chalk During Early-Stage Organic Maturation? Society of Petrophysicists and Well-Log Analysts.

Singer, J.M., Johnston, L., Kleinberg, R.L., Flaum, C., 1997, Fast NMR Logging for Bound Fluid and Permeability, Society of Petrophysicists and Well-Log Analysts, SPWLA-1997-YY.

Mitra, P. P.; Sen, P. N., 1992: Effects of Microgeometry and Surface Relaxation on NMR Pulsed-Field-Gradient Experiments: Simple Pore Geometries. Physical Review B., 45, 143-156.

Hirasaki, G. J., Rohan, J. A., Dudley, J. W., 1995: Interpretation of Oil-Water Relative Permeabilities from Centrifuge Experiments. SPE Advanced Technology Series, vol. 3, No. 1, pp. 66-75.

Hidajat, I., Mohanty, K.K., Flaum, M., Hirasaki, G.J., 2004, Study of Vuggy Carbonates Using NMR and X-Ray CT Scanning, SPE Reservoir Evaluation & Engineering, SPE 88995.

Lee, A.L., Ellington, R.T., 1965, Viscosity of n-Decane in the Liquid Phase, Journal of Chemical and Engineering Data, 346-348.

Glover, P. W. J., 2016: Archie's Law—A Reappraisal. Solid Earth., 7, 1157-1169.

Kenyon, W.E., Day, P.I., Straley, C., Willemsen, J.F., 1988: A Three-part Study of NMR Longitudinal Relaxation Properties of Water-saturated Sandstones, Society Petroleum Engineers, SPE-15643-PA.

Epstein, N., 1989: On Tortuosity and the Tortuosity Factor in Flow and Diffusion Through Porous Media, Chemical Engineering Science., 44, 777-779.

Carman, P. C., 1997: Fluid Flow Through Granular Beds, Process Safety and Environmental Protection: Transactions of the Institution of Chemical Engineers, Part B., 75, S32-S48.

Coates G.R., Miller, M., Gillen, M., Henderson, C., 1991: The MRIL in Conoco 33-1: An Investigation of a New Magnetic Resonance Imaging Log, Society of Petrophysicists and Well-Log Analysts, SPWLA-1991-DD.

Chen, Z., Wang, X., Jian, G., Zhang, L., Dong, P., Singer, P. M., & Hirasaki, G. J., 2020: Fast Permeability Estimation pf an Unconventional Formation Core by Transient-Pressure History Matching, Society Petroleum Engineers Journal.

Bernabé, Y.; Mok, U.; Evans, B., 2006: A Note on the Oscillating Flow Permeability. International Journal of Rock Mechanics and Mining Sciences, 43, 311-316.

Carey, G. R.; McBean, E. A.; Feenstra, S., 2016: Estimating Tortuosity Coefficients Based on Hydraulic Conductivity. Groundwater, 54, 476-487.

Tinni, A.; Sondergeld, C.; Rai, C. New Perspectives on the Effects of Gas Adsorption on Storage and Production of Natural Gas from Shale Formations. 2018, 59, 99-104.

Singer, P. M.; Chen, Z.; Alemany, L. B.; Hirasaki, G. J.; Zhu, K.; Xie, Z. H. Z. H.; Vo, T. D. NMR Relaxation of Polymer-Alkane Mixes, A Model System for Crude Oils. SPWLA 58th Annual Logging Symposium 2017.

Kausik, R.; Fellah, K.; Rylander, E.; Singer, P. M.; Lewis, R. E.; Sinclair, S. M. NMR Relaxometry in Shale and Implications for Logging. Petrophysics 2016, 57, 339-350.

Hürlimann, M. D.; Freed, D. E.; Zielinski, L. J.; Song, Y. Q.; Leu, G.; Straley, C.; Minh, C. C.; Boyd, A. Hydrocarbon Composition from NMR Diffusion and Relaxation Data. Petrophysics 2009, 50, 116-129.

\* cited by examiner

DETERMINATION OF FLUID-PHASE-SPECIFIC PETROPHYSICAL PROPERTIES OF GEOLOGICAL CORE FOR OIL, WATER AND GAS PHASES

CROSS-REFERENCE TO RELATED APPLICATIONS

This patent application claims the benefit of U.S. Provisional Patent Application No. 63/005,482 filed on Apr. 6, 2020, which is incorporated herein by reference in its entirety.

BACKGROUND AND RELATED ART

The present invention relates to petroleum reservoir fluid and petrophysical characterization. In particular, the present invention is useful for quantifying fluid phase-specific petrophysical properties (FPS-PP) of three different phases (water, oil and gas) of a subsurface formation using multinuclear NMR restricted diffusion and automated centrifuge measurements of effluent volumes, those phase-specific petrophysical properties including tortuosity, pore size, body-to-throat ratio, porosity, permeability, and relative permeability curves for two specific phases.

The following invention is useful in the petroleum industry for determining several phase-specific petrophysical properties of a geological formation for three different phases: water, oil, and gas, in both conventional and unconventional formations. In petroleum reservoirs, there are either two or three phases present in the pore space, i.e. water and oil, water and gas, or water plus oil and gas. The different phases occupy different locations in the pore space of the formation. The permeability of a phase describes the flow rate of that fluid in a porous media with an applied pressure gradient. It is useful in evaluating reservoir quality and productivity during primary, secondary and tertiary production. The determination of permeability is useful in deciding on casing, perforating, and whether to deploy a pump in a well. It is difficult to effectively measure permeability for each of three phases present in the formation using current methods. The following invention is a method to determine fluid phase-specific petrophysical properties for each of three separate fluid phases (water, oil and gas) in both conventional and unconventional formations using NMR restricted diffusion measurements with multiple nuclei (i.e. $^1H$, $^{19}F$) and automated centrifugation with effluent volume measurements. The fluid phase-specific petrophysical properties include tortuosity, pore size, body-to-throat ratio, porosity, permeability, and relative permeability curves for two specific phases.

SUMMARY OF EMBODIMENTS

The summary of the invention follows for evaluating the properties of the three fluid phases in a core sample in this invention. The invention is a method of determining, for each of three different fluid phases (water, oil and gas), at least one fluid-phase-specific petrophysical property (FPS-PP) of geological core where FPS-PP$_{WATER}$ is the FPS-PP for the water phase, FPS-PP$_{OIL}$ is the FPS-PP for the oil phase, FPS-PP$_{GAS}$ is the FPS-PP for the gas phase.

The steps of this invention are summarized in the following table.

| Step | Action | FPS-PP |
|---|---|---|
| 1 | Clean and dry core: 100% saturated with air | |
| 2 | Routine core analysis: | |
| | Klinkenberg-corrected gas permeability ($k_{meas}$) | $k_{meas}$ |
| | Total porosity ($\phi_T$) | $\phi_T$ |
| | Grain density ($\rho_g$) | $\rho_g$ |
| | Bulk density ($\rho_b$) | $\rho_b$ |
| 3 | Saturate with brine to $S_{w1}$ and measure $^1H$ restricted diffusion NMR: 100% saturated with brine ($S_{w1}$) | d |
| | $D/D_0$ versus $L_D$ to get pore-body diameter (d) from $S/V = 4/d$ and diffusive tortuosity $\tau$ using the Padé fit, where D is measured diffusion, $D_0$ is bulk diffusion, and $L_D = \sqrt{D_0 t_\Delta}$ is the bulk diffusion length at a diffusion evolution time of $t_\Delta$ | $\phi_T$ $\rho_{2w}$ $\tau$ |
| | $T_2$ distribution to get $\phi_T$ and surface relaxivity for water ($\rho_{2w}$) | |
| 4 | Electrical resistivity and absolute k at $S_{w1}$ | m |
| | Measure electrical resistivity $R_o$ | $\tau_e$ |
| | Measure or calculate $R_w$ of the brine | k |
| | Use $R_o/R_w = 1/\phi_T^m$ to obtain m | d |
| | Calculate electrical tortuosity $\tau_e = \phi_T^{-m}$ for water at $S_{w1}$ | BTR |
| | Use absolute permeability (k), d, $\phi_T$, $\tau$ in the modified Carman-Kozeny equation: $k = A\dfrac{\phi_T d^2}{32 \tau BTR^2}$ or other relation to determine BTR. | |
| 5 | Centrifuge core (drainage cycle) to $S_{wirr}$ for $k_{rw}$ | Measure |
| | Measure relative permeability of water ($k_{rw}$) with decreasing water saturation ($S_w$) from $S_{w1}$ to irreducible water $S_{wirr}$ by history matching water production | $k_{rw}$ vs $S_w$, $S_{w1} \to S_{wirr}$ |
| 6 | Electrical resistivity and tortuosity at $S_{wirr}$ | n |
| | Measure resistivity $R_t$ at $S_{wirr}$ | $\tau_e$ |
| | Use $R_t/R_o = 1/S_{wirr}^n$ to obtain n | |
| | Calculate electric tortuosity $\tau_e = \phi_T^{1-m} S_w^{1-n}$ for water as a function of $S_w$ | |
| 7 | Measure $^1H$ NMR at $S_{wirr}$ | $d_{wirr}$ |
| | $T_2$ to get pore-body diameter ($d_{wirr}$) at $S_{wirr}$ from $S/V = 4/d_{wirr}$ using $\rho_{2w}$ | |

-continued

| Step | Action | FPS-PP |
|---|---|---|
| 8 | Predict $k_{rw}$ VS $S_w$<br>Calibrate $k_{rw}$ (=$k_w/k$) relation using $d_{wirr}$, $\phi_T S_w$, $\tau_w$, k based on<br>Carman–Kozeny $k_w = A_w \dfrac{\phi_T S_w d_{wirr}^2}{32\tau_w BTR^2}$ or other relation, by comparing<br>to centrifuge data in step 5 | Predict<br>$k_{rw}$ vs $S_w$, $S_{w1} \to S_{wirr}$ |
| 9 | Centrifuge core (drainage cycle) to $S_{wirr}$ for $k_{rw}$ using $D_2O$<br>Dry sample<br>Saturate with $D_2O$<br>Centrifuge to air down to $S_{wirr}$<br>Measure $k_{rw}$ with decreasing $S_w$ from $S_{w1} \to S_{wirr}$ by history matching fluid production<br>Verify step 5 | Verify<br>$k_{rw}$ vs $S_w$,<br>$S_{w1} \to S_{wirr}$ |
| 10 | Saturate with C1 and measure $^1$H NMR:<br>$D/D_0$ versus $L_D$ to get $\tau_{hc}$ for C1(D2O) at $S_{wirr}$ using the Padé fit | $\tau_{hc}$<br>at $S_{wirr}$ |
| 11 | Saturate with C10 and measure $^1$H NMR:<br>$D/D_0$ versus $L_D$ to get pore-body diameter ($d_{hc}$) from $S/V = 4/d_{hc}$ for C10(D2O) at $S_{wirr}$ using the Padé fit<br>$T_2$ to get $\phi_{hc}$ and surface relaxivity for C10 ($\rho_{2hc}$) | $d_{hc}$<br>$\phi_{hc}$<br>$\rho_{2hc}$ |
| 12 | Centrifuge core (drainage cycle) to $S_{or}$ for $k_{ro}$<br>Centrifuge with air or nitrogen (drainage cycle) down to $S_{or}$ at $S_{wirr}$<br>Measure relative permeability of oil $k_{ro}$ (=$k_o/k$) with decreasing oil saturation ($S_o$) at $S_{wirr}$ down to $S_{or}$ by history matching C10 production. This simulates gas injection to displace oil or gravity drainage in a gas cap. | Measure<br>drainage<br>cycle<br>$k_{ro}$ vs $S_o$,<br>at $S_{wirr}$<br>down to $S_{or}$ |
| 13 | Predict $k_{ro}$ vs $S_o$<br>Calibrate $k_{ro}$ at $S_{wirr}$ down to $S_{or}$ using $d_{hc}$, $\phi_{hc}$, $\tau_{hc}$, k based on<br>Carman–Kozeny $k_o = A_o \dfrac{\phi_{hc} d_{hc}^2}{32\tau_{hc} BTR^2}$ or other relation, by comparing<br>to centrifuge data in step 12 | Predict<br>$k_{ro}$ vs $S_o$ at $S_{wirr}$ down to $S_{or}$ |
| 14 | Estimate the relative permeability ratio for oil and water<br>Estimate relative permeability ratio K = $k_{ro}/k_{rw}$ | K |
| 15 | Saturate with C10. Centrifuge with $D_2O$ in an imbibition cycle:<br>$k_{ro}$ vs $S_o$ in the imbibition cycle. This simulates a waterflood. | Measure<br>imbibition<br>cycle $k_{ro}$ vs $S_o$ |
| 16 | Clean core using Soxhlet extraction with chloroform-methanol azeotrope to remove residual C10 and $D_2O$. Fully saturate with $D_2O$. Centrifuge with C10 In drainage cycle to $S_{wirr}$. Centrifuge with air or nitrogen in drainage cycle to $S_{or}$ and $S_{wirr}$. | |
| 17 | Saturate with pressurized fluorocarbon gas and measure $^{19}$F NMR:<br>$D/D_0$ versus $L_D$ to get $\tau_g$ for fluorocarbon gas at $S_{wirr}$ and $S_{or}$ using the Padé fit | $\tau_g$<br>at $S_{wirr}$ & $S_{or}$ |
| 18 | Release gas pressure. Saturate with fluorocarbon oil and measure $^{19}$F NMR:<br>$D/D_0$ versus $L_D$ to get pore-body diameter ($d_g$) from $S/V = 4/d_g$ for fluorocarbon oil at $S_{wirr}$ & $S_{or}$ using the Padé fit<br>$T_2$ to get $\phi_g$ and surface relaxivity for fluorocarbon oil ($\rho_{2g}$) | $d_g$<br>$\phi_g$<br>$\rho_{2g}$ |
| 19 | Centrifuge core in water (imbibition cycle) to $S_{gr}$ for $k_{rg}$<br>Centrifuge with water or D2O (imbibition cycle) down to $S_{gr}$ at $S_{or}$ and $S_{wirr}$<br>Measure relative permeability of a fluorocarbon oil phase simulating gas $k_{rg}$ (=$k_g/k$) with decreasing gas saturation ($S_g$) at $S_{or}$ down to $S_{gr}$ by history matching the fluorocarbon production. | Measure<br>imbibition<br>cycle to<br>increasing<br>water<br>$k_{rg}$ vs $S_g$, at $S_{or}$ |
| 20 | Predict $k_{rg}$ at $S_{or}$<br>Calibrate the relative permeability of gas ($k_{rg}$) at $S_{or}$ using $d_g$, $\phi_g$,<br>$\tau_g$, k based on Carman–Kozeny $k_g = A_g \dfrac{\phi_g d_g^2}{32\tau_g BTR^2}$ or other relation. | Predict<br>$k_{rg}$ at $S_{or}$ |
| 21 | Clean and dry core:<br>100% saturated with air | |
| 22 | MICP and BTR<br>Measure MICP (mercury injection capillary pressure) to obtain pore-throat diameter ($d_{MICP}$)<br>Determine BTR = $d/d_{MICP}$ (body-throat ratio) | $d_{MICP}$<br>BTR |

| Step | Action | FPS-PP |
|---|---|---|
| 23 | Develop relation for relative permeability $k_{rX}$ of each phase<br>Develop relation for permeability $k_{rX}$ (=$k_X/k$) of each of the three phases (X = w, o, g) as a function of the tortuosity ($\tau_X$), porosity ($\phi_X$), pore-body diameter ($d_X$) from S/V = 4/$d_X$, and BTR based on Carman–Kozeny $k_X = A_X \dfrac{\phi_X d_X^2}{32\tau_X BTR^2}$ or other relation. | $k_{rX}$<br>(X = w, o, g) |

DETAILED DESCRIPTION OF EMBODIMENTS

Step 1: We begin with a core sample that is cleaned and dried. Soxhlet extraction with chloroform-methanol azeotrope may be used to clean out the hydrocarbons. At this stage, the core sample is fully saturated with air in the pore space. Soxhlet extraction with chloroform-methanol azeotrope is well known to one skilled in the art.

Step 2: A routine core analysis is performed for Klinkenberg-corrected gas permeability ($k_{meas}$), total porosity ($\phi_T$), grain density ($\rho_g$), and bulk density ($\rho_b$). Routine core analysis is well known to one skilled in the art.

Figure 1:
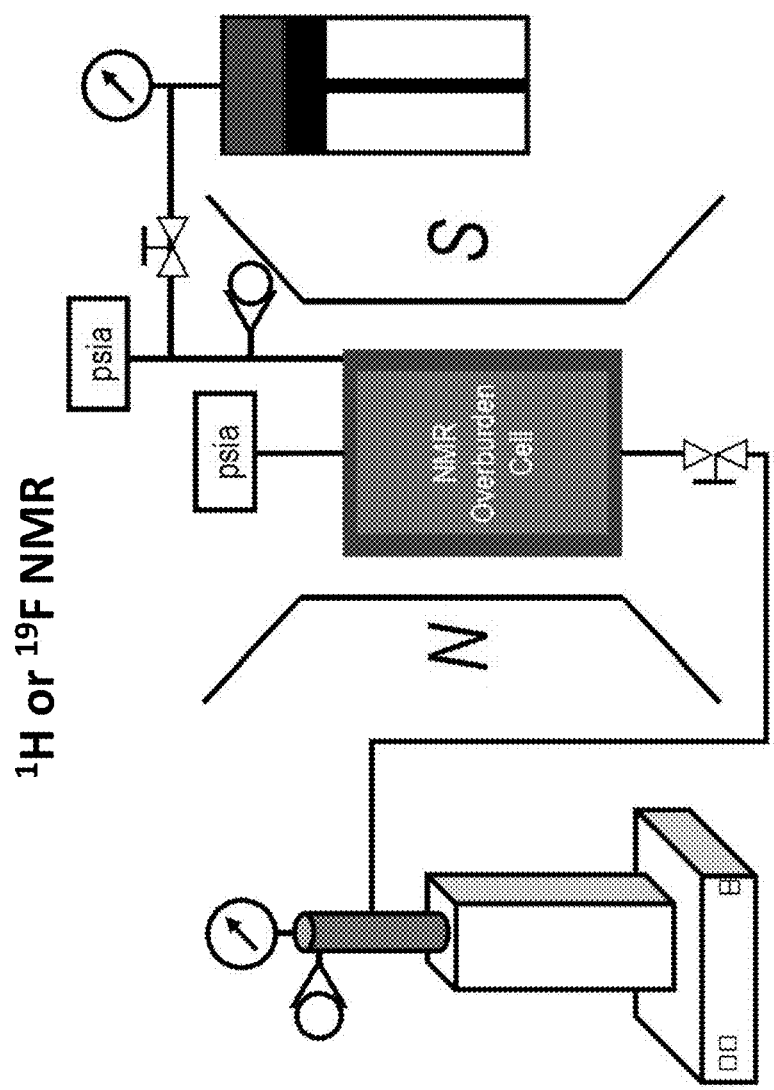
FIG. 1: $^1$H and $^{19}$F NMR spectrometer and fluid saturation equipment used in this invention.

Step 3: The core sample is then 100% saturated with NaCl brine ($S_{w1}$). $^1$H NMR measurements of $D/D_0$ versus $L_D$ and $T_2$ are made at $S_{w1}$. FIG. 1 shows a schematic of the NMR spectrometer with laboratory apparatus for fluid saturation used in this invention. The NMR spectrometer may have a probe that can be tuned to different NMR active nuclei, such as $^1$H and $^{19}$F. The NMR spectrometer may have replaceable magnets for applying different magnetic field strengths. Typical NMR spectrometers are available from Oxford Instruments Ltd for 2 MHz, 20 MHz, 40 MHz, and 60 MHz.

Figure 2:
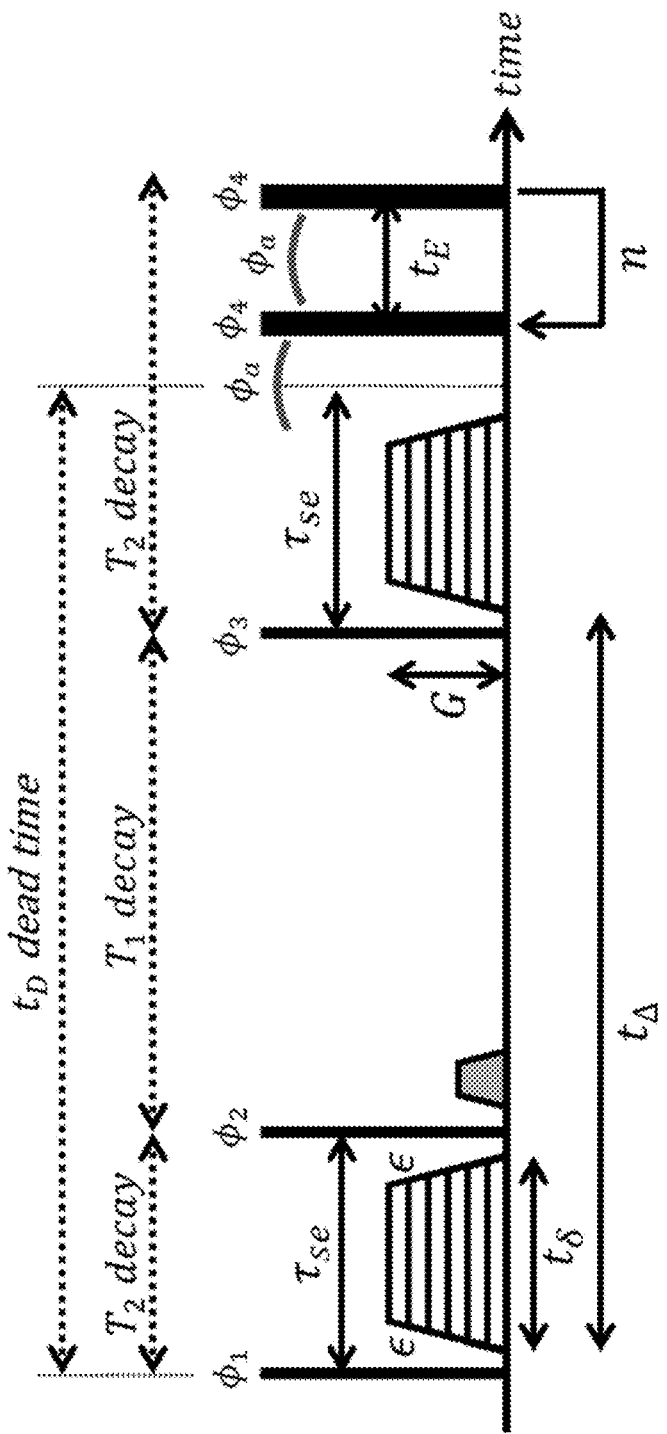
FIG. 2: NMR pulse sequence used in this invention.

FIG. 2 shows a Diffusion-$T_2$ (a.k.a. D-$T_2$) unipolar stimulated-echo pulse sequence (Tanner, 1970; Mitchell et al., 2014) used to measure restricted diffusion as a function of diffusion time $t_\Delta$. Trapezoidal gradient encoding pulses G are shown with duration to (time from half-height to half-height) and ramp-time ε, along with 90° (thin) and 180° (thick) RF pulses of phase $\phi_{1,2,3,4,a}$, and CPMG echo trains with echo-spacing $t_E$. Not shown is a set of 6 "woodpecker" gradient pulses to stabilize the eddy currents before the first RF pulse. More details can be found in the attached references (Chen et al 2017, Chen et al 2019a, Chen et al 2019 b, Wang et al 2020.

Figure 3:
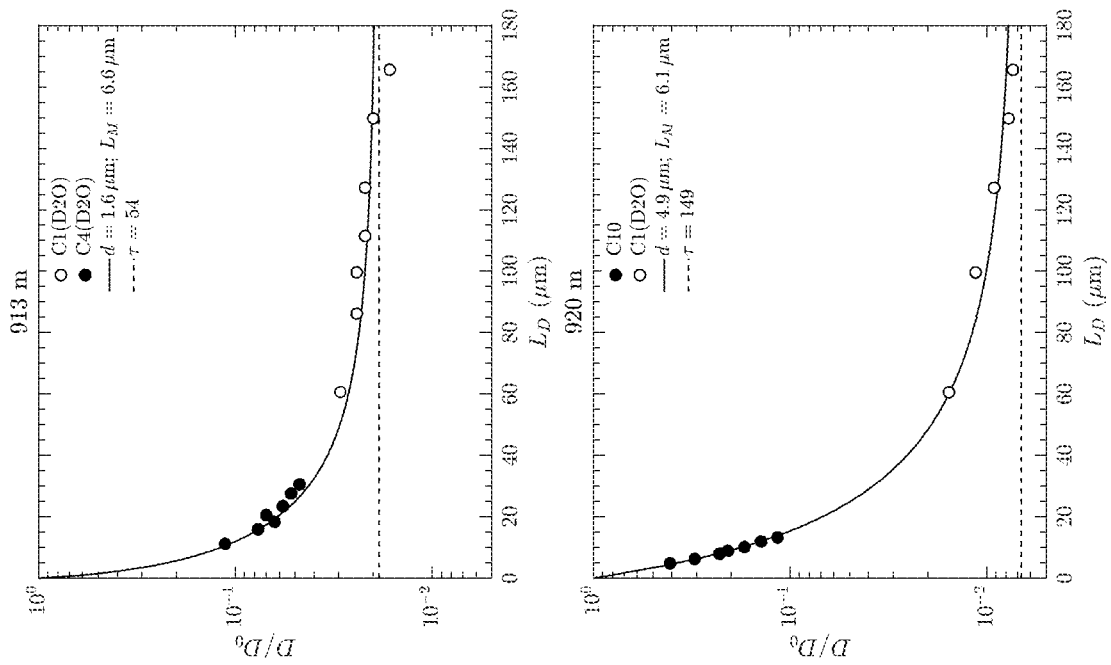
FIG. 3: Padé fits to $D/D_o$ vs LE for two chalk cores from a well at depths of 913 m and 920 m.

FIG. 3 shows diffusion length ($L_D$) against normalized restricted diffusivity ($D/D_0$). The dots are the points from the 2D peak of the D-$T_2$ maps in the region C. Top: C4($D_2O$) and C1($D_2O$) are shown for 913 m (sample contains less bitumen). Bottom: C10 and C1($D_2O$) are shown for 920 m (sample contains more bitumen). The solid black line is the best fit using the Padé equation. The dashed horizontal line shows the tortuosity limit. To do the parameter estimation, non-linear curve-fitting (lsqcurvefit) in MATLAB is applied. The loss function is the minimum square error on a log scale.

From these measurements, we can determine the total porosity ($\phi_T$) from $T_2$, and the pore-body diameter (d) from the relation for cylindrical pores:

$$\frac{S}{V} = \frac{4}{d}$$

using the Padé fit on the $D/D_0$ versus $L_D$ data, where D is measured diffusion, $D_0$ is bulk diffusion, and $L_D = \sqrt{D_0 t_\Delta}$ is the bulk diffusion length at a diffusion evolution time of $t_\Delta$. Note that while the above relation for cylindrical pores is not required in the permeability relations, it is used throughout for convenience. It is on the other hand required when computing the BTR (body-throat ratio) from MICP data (see below) which assumes cylindrical pores.

Step 4: The electrical resistivity ($R_o$) is measured on the fully brine-saturated core. The electrical resistivity of the brine is also measured ($R_w$) or calculated from the NaCl concentration. The cementation exponent, m, can be measured using the formation factor from Archie's law:

$$\frac{R_o}{R_w} = \frac{1}{\phi_T^m}$$

where $\phi_T$ is the porosity measured in the previous steps (using either routine core analysis or NMR measurements at $S_{w1}$). The cementation exponent indicates how well-connected the pore geometry is. It is about m=2 for many rocks but can be higher for vuggy carbonates. This is well known to one skilled in the art.

The tortuosity (τ) of the water phase at $S_{w1}$ can also be determined from the electrical resistivity measurements as is well known to one skilled in the art:

$$\tau = \phi_T^{1-m}$$

Figure 4:
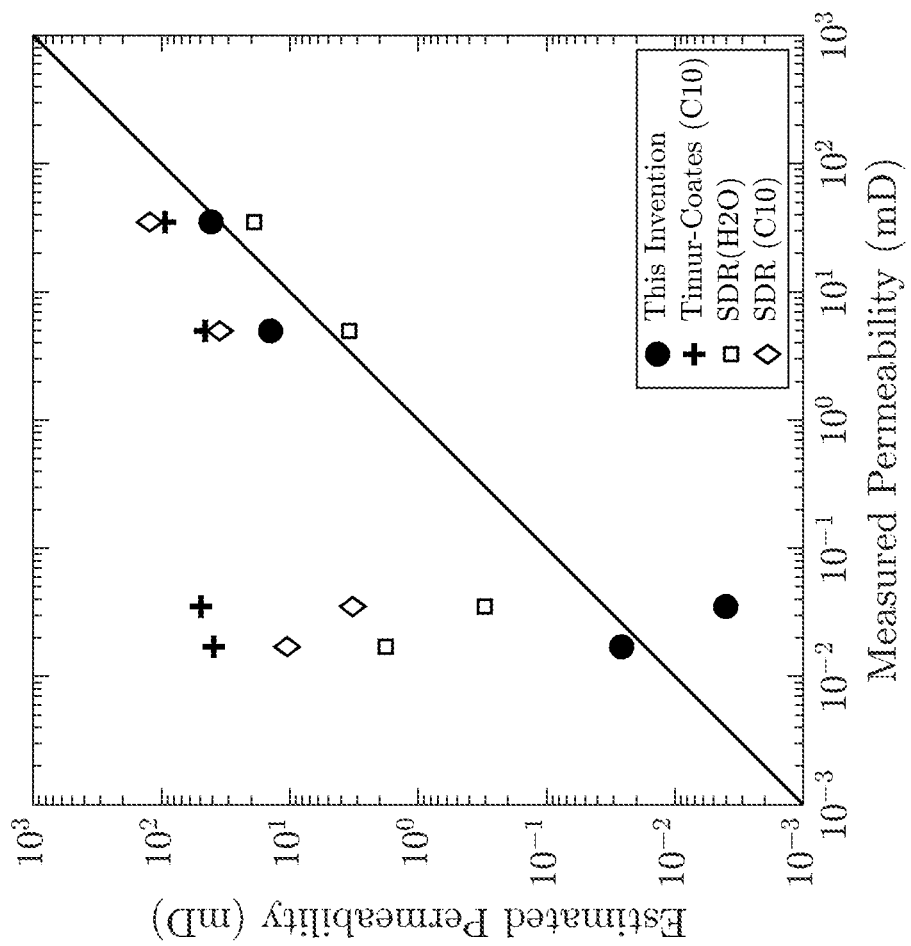
FIG. 4: Permeabilities computed from this invention and using prior art compared with measured permeabilities for four chalk samples.

The permeability is now obtained using an equation modified from the Carman-Kozeny equation, which assumes parallel capillary tubes. The modified Carman-Kozeny equation for permeability (k) from d (where S/V=4/d), $\phi_T$, $\tau$, BTR:

$$k = A \frac{\phi_T d^2}{32 \tau BTR^2}$$

where A is a free parameter to be calibrated by comparing to $k_{meas}$. FIG. 4 shows a core sample's estimated permeability versus its measured permeability using this invention versus using three older methods. This is explained in more detail in the attached references (Chen et al. 2020, Chen et al. 2019b, Chen et al. 2019a, Chen et al. 2017, Wang et al. 2020).

Another equation besides Carman-Kozeny can also be used. Other equations are listed in the attached references. Note that all the quantities in this equation are measured by $^1$H NMR or centrifuge, except BTR. Hence BTR may be determined from this data set.

Figure 5:
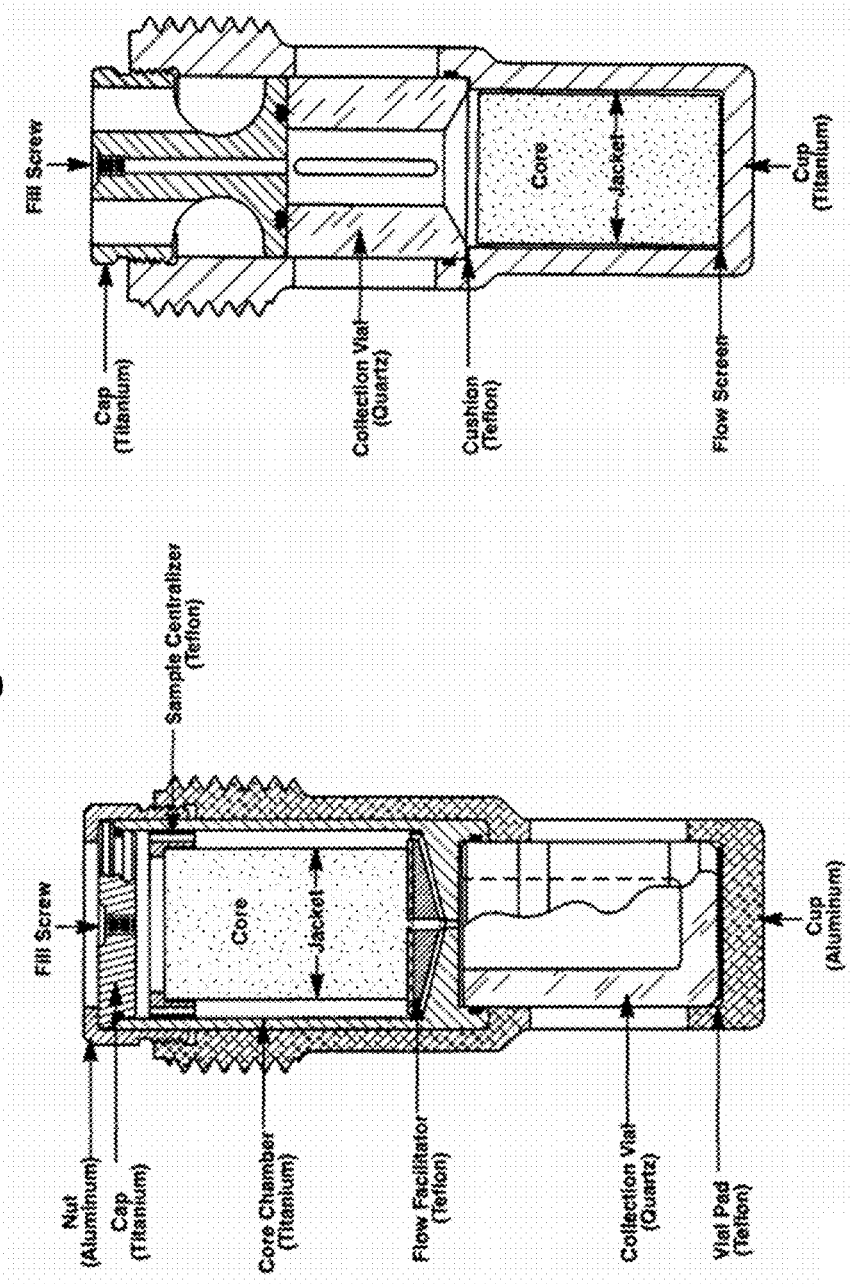
FIG. 5: Centrifuge sample cells used in drainage and imbibition experiments.

Step 5: Next, the relative permeability of water $k_{rw}$ (=$k_w/k$) is determined with decreasing water saturation ($S_w$) from $S_{w1}$ to irreducible water $S_{wirr}$ using a centrifuge drainage measurement. FIG. 5 shows centrifuge sample holders for drainage experiments and imbibition experiments [Hirasaki 1992}. Examples of a commercial automated centrifuge that can be used in this invention are available from Vinci Technologies (RC4500). The core sample is placed in a centrifuge core holder and centrifuged to air (drainage cycle) at a high speed down to $S_{wirr}$. The water in the core sample is replaced with gas (e.g. air, nitrogen) during centrifugation. As the core is centrifuged, the automated centrifuge measures the time dependence of the flow rate of effluent from the core. The fluid production versus time are monitored and then history-matched to determine the curve of $k_w$ versus $S_w$, as outlined in [Hirasaki 1992] and [Hirasaki 1995]. One advantage of the centrifuge measurement is that it is gravity-stable; that is, no viscous fingering occurs. Another advantage is that extremely small values of $k_{rw}$ can be measured. This is useful for determining $k_{rw}$ at endpoint saturations, i.e. at residual oil saturation ($S_{or}$) or at $S_{wirr}$.

Step 6: At irreducible water saturation, the electrical resistivity of the core sample is measured ($R_t$). The saturation exponent, n, is measured using the resistivity index from Archie's law:

$$\frac{R_t}{R_o} = \frac{1}{S_w^n}$$

where $S_w$ is the water saturation (this should be irreducible water saturation $S_{wirr}$). The value for n indicates how the fluids affect the resistivity of the rock. In water-wet conventional rocks, it is common for n to be around n≈2. In mixed-wet and oil-wet rocks, n is much higher n>2 at lower $S_w$. In shaly-sands, n may be lower n<2 as $S_w$ decreases.

The tortuosity of the water phase at irreducible saturation can be determined using:

$$\tau_w = \phi_T^{1-m} S_w^{1-n}$$

assuming that Archie's Law is valid.

Step 7: $^1$H NMR $T_2$ measurements are made at $S_{wirr}$ to get pore-body diameter ($d_{wirr}$) from S/V=$^4$/$d_{wirr}$ using the previously determined $\rho_{2w}$ at $S_{w1}$ as such:

$$\frac{1}{T_2} = \rho_{2w} \frac{S}{V} = \rho_{2w} \frac{4}{d_{wirr}}$$

This equation assumes the fast-diffusion regime, which is typically the case.

Step 8: The relative permeability of water $k_{rw}$ is predicted using $d_{wirr}$, $\phi_T S_w$, $\tau_w$, k based on Carman-Kozeny relation:

$$k_w = A_w \frac{\phi_T S_w d_{wirr}^2}{32 \tau_w BTR^2}$$

where $A_w$ is a free parameter to be calibrated by comparing to centrifuge data in step 5. Another relation besides Carman-Kozeny can also be used.

Step 9: The core sample is cleaned and dried and then saturated with heavy water brine (e.g. $D_2O$ with NaCl matching in situ brine concentration). The reason $D_2O$ is used is that there is no $^1$H NMR signal from $D_2O$, therefore the only $^1$H NMR signal that will later be detected is from the hydrocarbons. The core is centrifuged to air down to $S_{wirr}$ using the apparatus in FIG. 5. The fluid production and saturation are monitored and then history matched (Hirasaki et al 1992 and 1995) to determine the $k_{rw}$. The $k_{rw}$ using $D_2O$ brine can be checked against $k_{rw}$ estimated from the centrifugation of the $H_2O$ brine-saturated core in step 5.

Step 10: The core sample is saturated with high-pressure methane (C1), and $^1$H NMR measurements are made using the sample, where only the hydrocarbon phase is detectable. Restricted diffusivity $D/D_0$ versus $L_D$ measurements are made to get $\tau_{hc}$ for C1($D_2O$) at $S_{wirr}$ using the Padé fit. C1 has a large diffusion coefficient $D_0$, therefore a large $L_D$. If $L_D$>>d then $\tau_{hc}$ can be determined from the Padé fit.

Step 11: The C1 is allowed to evaporate, and the resulting air-filled porosity is then replaced by with decane (C10). $^1$H NMR $D/D_0$ versus $L_D$ measurements are made to get pore-body diameter ($d_{hc}$) from S/V=4/$d_{hc}$ for C10($D_2O$) saturated cores at $S_{wirr}$ using the Padé fit. C10 has a small diffusion coefficient $D_0$, therefore a small $L_D$. If $L_D$<<d then the $d_{hc}$ can be determined from the Padé fit. $T_2$ measurements are also made to get the C10-filled porosity ($\phi_{hc}$) and surface relaxivity ($\rho_{2hc}$) for C10.

Figure 6:
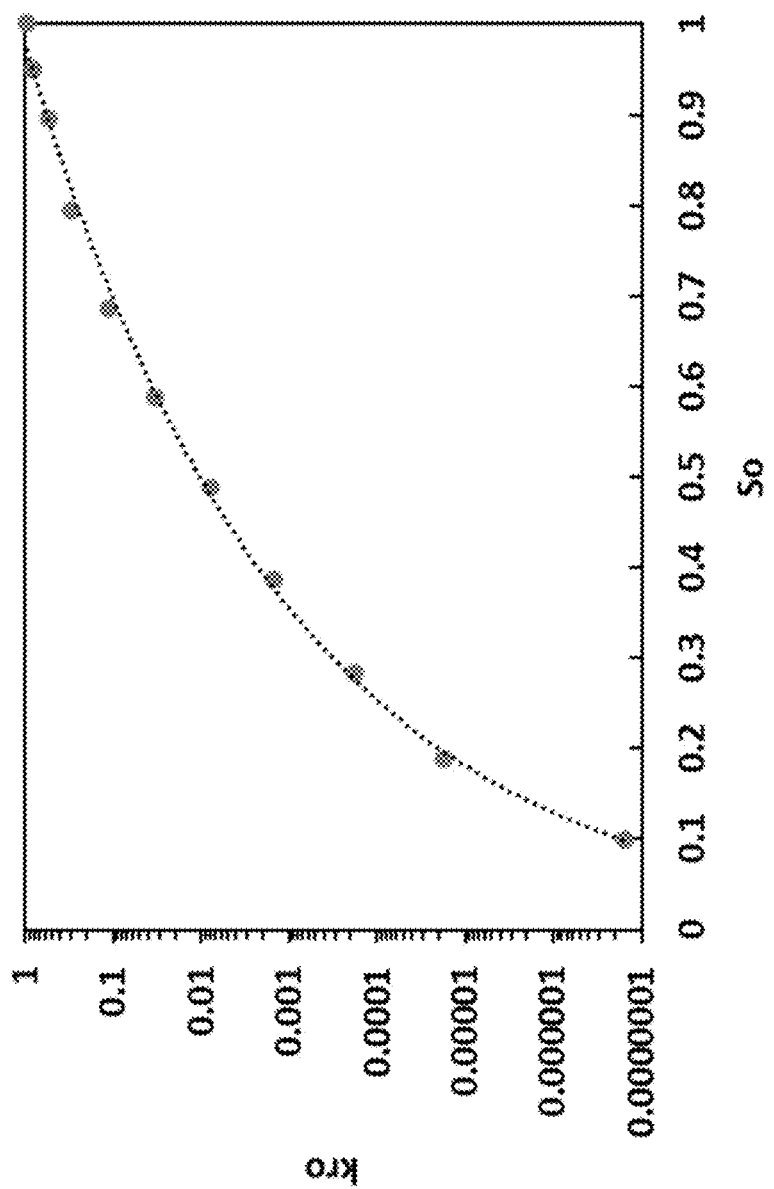
FIG. 6: Centrifuge relative permeability to oil ($k_{ro}$) vs oil saturation ($S_o$) data for a Berea sandstone (first drainage with decane/nitrogen).

Step 12: The core is centrifuged in drainage cycle using air or nitrogen down to $S_{or}$ at $S_{wirr}$. The relative permeability of oil $k_{ro}$ (=$k_o/k$) is measured with decreasing oil saturation (S) at $S_{wirr}$ down to $S_{or}$ by history matching C10 production. An example is shown in FIG. 6 for a Berea sandstone with n-decane being displaced by nitrogen (first drainage), where $k_{ro}$ (=$k_o/k$) is measured versus So down to $k_{ro}$=$10^{-7}$.

Step 13: The relative permeability to oil $k_{ro}$ at $S_{wirr}$ down to $S_{or}$ is predicted using $d_{hc}$, $\phi_{hc}$, $\tau_{hc}$, k based on the modified Carman-Kozeny relation:

$$k_o = A_o \frac{\phi_{hc} d_{hc}^2}{32 \tau_{hc} BTR^2}$$

where $A_0$ is a free parameter calibrated by comparing to the centrifuge data in step 12. Another relation besides Carman-Kozeny can also be used.

Step 14: The relative permeability ratio (K) between oil and water can be estimated by taking the ratio of the oil relative permeability ($k_{ro}$) to the water relative permeability ($k_{rw}$):

$$K = \frac{k_{ro}}{k_{rw}}$$

Step 15: The core is saturated with decane (C10) and then centrifuged with $D_2O$ in an imbibition cycle to measure $k_{ro}$ vs $S_o$. This simulates a waterflood.

Step 16: The core is cleaned using Soxhlet extraction with chloroform-methanol azeotrope to remove the residual C10 and $D_2O$. The core is dried and then fully saturated with $D_2O$. The core is centrifuged with decane in a drainage cycle to $S_{wirr}$. The core is then centrifuged with air or nitrogen in a drainage cycle to $S_{or}$ and $S_{wirr}$. The core sample at this stage should resemble the core sample at the end of step 12.

Step 17: In order to simulate a third phase (gas), the core at $S_{or}$ is then saturated with high-pressure fluorinated gas that is insoluble in water. This fluorocarbon gas is the analog of methane ($CH_4$) used for measuring hydrocarbon-filled tortuosity. The fluorocarbon gas will be selected based on large $D_0$ and therefore large $L_D$, as well as large FI (fluorine index) for high SNR (signal-to-noise ratio); see below.

At this stage, the core has three phases in the pore space: $D_2O$ brine at $S_{wirr}$ (most likely in the smallest pores if the sample is water wet), residual C10 at $S_{or}$, and fluorocarbon gas. $^{19}F$ NMR $D/D_0$ versus $L_D$ measurements are made to probe the large $L_D$ region of the $D/D_0$ versus $L_D$ curve in order to measure the tortuosity of the gas phase ($\tau_g$), using the Padé fit.

Step 18: The fluorocarbon gas is evacuated from the core by releasing the gas pressure and the core is then saturated with a fluorocarbon liquid that is insoluble in both oil and water. $^{19}F$ NMR measurements of $D/D_0$ versus $L_D$ are made for the short $L_D$ region of the $D/D_0$ versus $L_D$ curve to measure the pore-body diameter of the gas phase ($d_g$) from $S/V=4/d_g$ at $S_{wirr}$ & $S_{or}$, using the Padé fit. $T_2$ measurements will also be made to get the porosity (q) of the gas phase, as well as the surface relaxivity ($\rho_{2g}$).

Step 19: The core is centrifuged with water in an imbibition cycle down to $S_{gr}$ at $S_{or}$. The relative permeability of gas is measured ($k_{rg}=k_g/k$) with decreasing gas saturation ($S_g$) at $S_{or}$ down to $S_{gr}$ by history matching the fluorocarbon production.

Step 20: The relative permeability to gas ($k_{rg}$) at $S_{or}$ is predicted using $d_g$, $\phi_g$, $\tau_g$, k based on the modified Carman-Kozeny relation:

$$k_g = A_g \frac{\phi_g d_g^2}{32\tau_g BTR^2}$$

where $A_g$ is a free parameter to be calibrated from the data set. Another relation besides Carman-Kozeny can also be used.

Step 21: The core sample is then evacuated, cleaned by Soxhlet extraction, and dried.

Step 22: A MICP (mercury injection capillary pressure) measurement is made to obtain pore-throat diameter ($d_{MICP}$), as well as BTR (body-throat ratio):

$$BTR = \frac{d}{d_{MICP}}$$

where d is the pore-body diameter from Step 3.

Step 23: Using the data collected from the laboratory analysis above, we then calculate a relationship between the relation for permeability $k_{rX}$ (=$k_X$/k) of each of the three phases (X=w, o, g) as a function of the tortuosity ($\tau_X$), porosity ($\phi_X$), pore-body diameter ($d_X$) from $S/V=4/d_X$, and BT R based on the modified Carman-Kozeny:

$$k_X = A_X \frac{\phi_X d_X^2}{32\tau_X BTR^2} \text{ where } X = w, o, g$$

It is within the scope of this invention to use another relationship besides the modified Carman-Kozeny equation to determine the permeability.

One skilled in the art can construct a three-phase relative permeability model from the oil/water relative permeability curve and the oil/gas relative permeability curve using linear interpolation.

Alternative to $D_2O$ for $^1H$ Free Aqueous Phase

The above methodology uses $D_2O$ brine to produce a $^1H$ free aqueous phase, thereby leaving only the hydrocarbon phase detectable by $^1H$ NMR. However, $D_2O$ is costly, and it can take a long time to exchange $H_2O$ for $D_2O$ in tight low-porosity rocks.

An alternative is to exchange the $H_2O$ brine with $H_2O$ brine doped with paramagnetic ions, thereby separating the $^1H$ signal in the aqueous phase from the $^1H$ signal in the hydrocarbon phase. Some common paramagnetic ions used in NMR include Mn-EDTA, Gd-EDTA, $MnCl_2$, or $GdCl_3$, which are all readily available. In sufficient concentrations, the paramagnetic ions shorten the bulk relaxation times of the aqueous phase to $T_1 \approx T_2 \approx 1$ ms, thereby distinguishing it from the hydrocarbon phase. At even higher paramagnetic ion concentrations, the $^1H$ signal can be made shorter than the echo spacing of $t_E \approx 0.1$ ms, thereby making the aqueous phase undetectable.

Yet another alternative to diffusing in the $D_2O$ brine or Mn-EDTA brine, a faster route is to do a gravity-stable fluid displacement through the core.

Other NMR active nuclei may also be used in the practice of this invention, including $^{23}Na$ in the NaCl brine, and $^2H$ (deuterium NMR) in the $D_2O$ and $^{13}C$ in the hydrocarbons. Also, per-deuterated versions of the hydrocarbons may also be used. However, these other NMR active nuclei have lower signal-to-noise ratio either because of lower gyromagnetic ratios or lower isotopic abundance, or both. $^1H$ and $^{19}F$ have the highest signal-to-noise ratio and it is easy to retune the NMR probe between $^1H$ and $^{19}F$. Higher magnetic fields would improve the signal-to-noise ratio of these lower sensitivity nuclei for the practice of this invention.

$^{19}F$ may also be used in the brine phase by adding NaF or $CaF_2$ salt or another fluorinated salt dissolved in the brine.

Another embodiment is to use the fluorocarbon oil instead of the hydrocarbon oil (decane), and in this case, use $H_2O$ instead of $D_2O$. In this embodiment, $^1H$ NMR provides the information about the water phase, and $^{19}F$ provides the information on the non-wetting "oil" phase.

Choice of Fluorocarbon Gas for $^{19}$F NMR

The choice of fluorocarbon gas is selected based on large $D_0$, and therefore large $L_D$, as well as large FI (fluorine index) for high SNR (signal-to-noise ratio). Another optimization is the pressure and temperature of the experiment. Higher pressure increases FI but decreases $D_0$, while higher temperature decreases FI but increases $D_0$. Increasing temperature from 30 C to 100 C reduces the SNR by $\approx \frac{1}{2}$ due to lower FI and the Boltzmann factor, with only a mild increase in L).

The FI are determined by first computing the number density of $^{19}$F nuclei ($N_{19}$) as such:

$$N_{19} = \frac{\rho n_{19} N_A}{M_W}$$

where $\rho$ is the gas density, Mw is the molecular weight, $N_A$ is Avogadro's number, and $n_{19}$ is the number of $^{19}$F nuclei per formula-unit. The FI is then divided by the number density of $^1$H nuclei for water $N_1$=66.7 $^1$H/nm$^3$ as such:

$$FI = \frac{N_{19}}{N_1} \frac{\gamma^{Fl}}{\gamma^H}$$

where $\gamma^{Fl}/\gamma^H$=0.94 is the ratio of gyromagnetic ratios for $^{19}$F compared to $^1$H.

Due to the lack of published measurements, the molecular diffusion for the gases is predicted using kinetic theory of gases:

$$D_0 \approx \frac{\mu}{P} \frac{RT}{M_W}$$

where $\mu$ is the dynamic viscosity of the gas, P is pressure, R is the ideal gas constant, and T is absolute temperature. The measured value $D_0 \approx 250$ μm$^2$/ms for CH$_4$ at 30° C. and 1200 psia is close to kinetic theory $D_0 \approx 245$ μm$^2$/ms, which justifies the above expression in the low-density regime.

FIG. 6 shows the FI for the fluorocarbon gases as a function of P for the accessible laboratory pressure, all at 30° C. Only data in the vapor phase or supercritical phase are shown, i.e. not in the liquid phase, since the vapor phase is of interest for large $D_0$. The CHF$_3$ has a maximum FI$\approx$0.11 in the vapor phase at 700 psia, while SF$_6$ has a maximum FI$\approx$0.09 in the vapor phase at 400 psia, which are lower than HI$\approx$0.14 for CH$_4$ at 1200 psia in [Chen 2019]. CF$_4$ has a larger FI$\approx$0.15 at 1200 psia, which increases with increasing P in the vapor phase.

Figure 7:
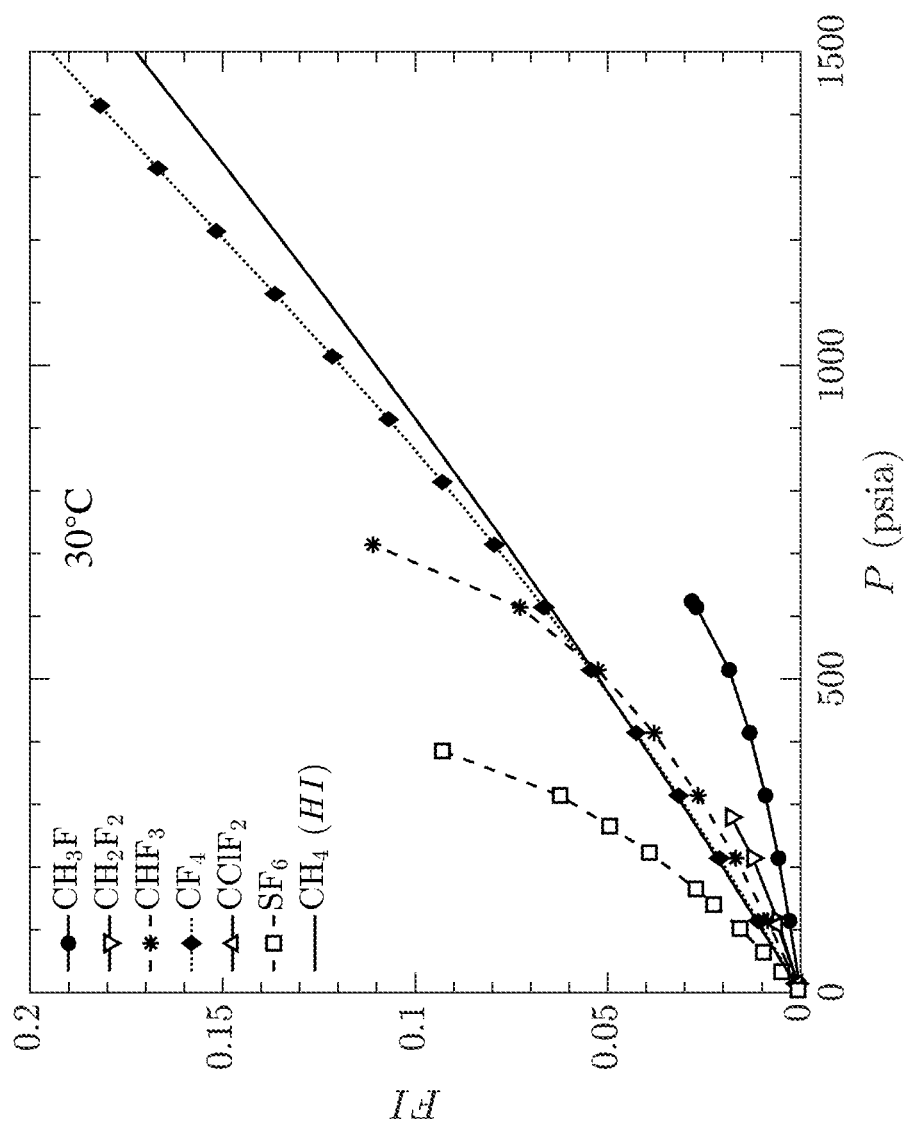
FIG. 7: Fluorine index FI vs pressure for some fluorinated hydrocarbons.
Figure 8:
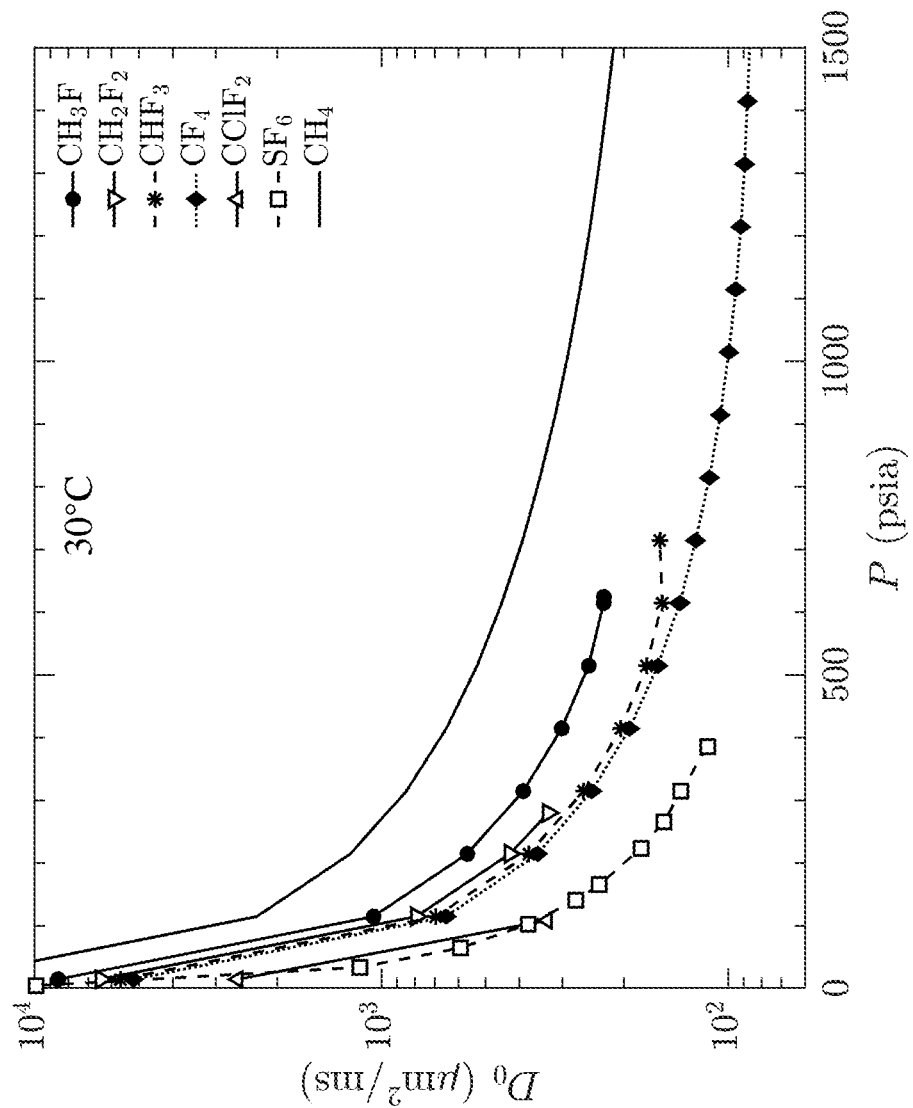
FIG. 8: Bulk diffusion $D_o$ versus pressure for some fluorinated hydrocarbons.

FIG. 7 shows $D_0$ for the fluorocarbon gases as a function of P for the typically accessible laboratory pressure, all at 30° C. At the largest vapor pressure of 700 psia, CHF$_3$ has a $D_0 \approx 160$ μm$^2$/ms. At the largest vapor pressure of 400 psia, SF$_6$ has a $D_0 \approx 110$ μm$^2$/ms. Meanwhile, CF$_4$ has a $D_0 \approx 90$ μm$^2$/ms at 1200 psia, which is lower than for CH$_4$ where $D_0 \approx 250$ μm$^2$/ms at 1200 psia.

Figure 9:
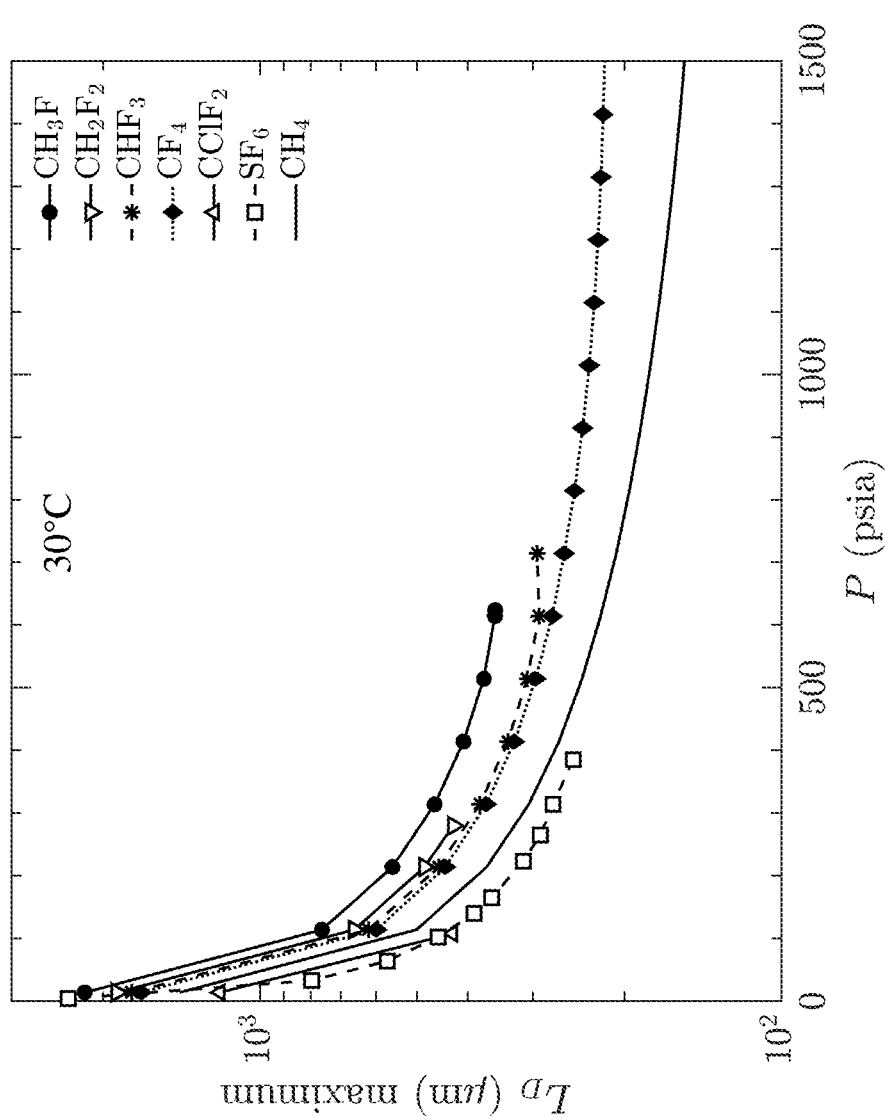
FIG. 9: Maximum diffusion length Lu versus pressure for some fluorinated hydrocarbons.

Of more interest than $D_0$ is the maximum diffusion length $L_D$ possible for each gas. FIG. 9 shows the dependence of maximum $L_D$ versus P for the fluorocarbon gases. Also shown for comparison is $L_D = \sqrt{D_0 t_A}$ for CH$_4$, where the maximum diffusion-evolution time is taken to be $t_A$=110 ms. The maximum $t_A$ is a consequence of decay due to $T_1 \approx 150$ ms surface relaxation for the wetting hydrocarbon gas [Chen 2019]. As such, the maximum is $L_D \approx 160$ μm for CH$_4$ at 1200 psia.

On the other hand, it is expected the fluorocarbon gas is non-wetting and therefore has no surface relaxation, i.e. it exhibits only bulk relaxation. A bulk relaxation time of $T_1 \approx 1000$ ms is loosely expected for the fluorocarbon gases, which is based on spin-rotation relaxation for bulk CH$_4$ and the presence of dissolved oxygen. As such, one can expect a maximum $t_A \approx 550$ ms for the fluorocarbon gases, which increases the maximum $L_D$. At the largest vapor pressure of 700 psia, CHF$_3$ has a maximum $L_D$ 300 μm. At the largest vapor pressure of 400 psia, SF$_6$ has a maximum $L_D \approx 250$ μm. Meanwhile, CF$_4$ has a maximum of $L_D$ 220 μm at 1200 psia. All three fluorocarbon gases have larger maximum $L_D$ than CH$_4$ due to larger accessible $t_A$.

The results are listed as such:

TABLE 1

Summary of results for the three most promising fluorocarbon gases, and CH$_4$ for comparison.

| Fluoro-carbon | T (° C.) | P (psia) | FI | $D_0$ (μm$^2$/ms) | $t_A$ (ms) maximum | $L_D$ (m) maximum |
|---|---|---|---|---|---|---|
| CHF$_3$ | 30 | 700* | 0.11 | 160 | 550 | 300 |
| SF$_6$ | 30 | 400* | 0.09 | 110 | 550 | 250 |
| CF$_4$ | 30 | 1200 | 0.15 | 90 | 550 | 220 |
| CH$_4$ | 30 | 1200 | 0.14** | 250 | 110 | 160 |

*maximum pressure of vapor phase.
**HI.

The optimal fluorocarbon gas at operating pressures above P>500 psia is CF$_4$ since FI is the largest, and $D_j$(or $L_D$) are comparable to the other fluorocarbon gases. CF$_4$ also has the potential to go to higher pressures, which increases FI without significantly decreasing $D_0$ (or $L_D$).

The optimal fluorocarbon gas at operating pressures below P<500 psia is SF$_6$ since FI and $D_0$ (or $L_D$) at P$\approx$400 psia are comparable to CF$_4$ at P$\approx$1000 psia.

Choice of Fluorocarbon Liquids for $^{19}$F NMR

The optimal fluorocarbon liquid is 3M Fluorinert Electronic Liquid FC-770. A list of relevant properties for FC-770 at 25° C. are given in 2.

TABLE 2

List of selected properties of 3M Fluorinert FC-770 at 25° C.

| Properties at 25° C. | Fluorinert FC-770 |
|---|---|
| Average molecular weight | 399 (g/mol) |
| Boiling point (@ 1 atm) | 95 (° C.) |
| Liquid density | 1.793 (g/cm$^3$) |
| Vapor pressure | 0.953 (psi) |
| Dynamic viscosity | 1.359 (cP) |
| Water solubility | 14 (ppmw) |
| Solubility in water | 1.3 (ppmw) |
| Interfacial tension with air | 14.8 (dyne/cm) |
| Interfacial tension with brine | 31.6 (dyne/cm) |
| Interfacial tension with n-decane | 6.2 (dyne/cm) |

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons skilled in the art.

REFERENCES

ATR Rock Catalog

Archie, G. E., 2003: The Electrical Resistivity Log as an Aid in Determining Some Reservoir Characteristics. SPE Reprint Series., 146, 9-16.

Bernabé, Y.; Mok, U.; Evans, B., 2006: A Note on the Oscillating Flow Permeability. International Journal of Rock Mechanics and Mining Sciences., 43, 311-316.

Carey, G. R.; McBean, F. A.; Feenstra, S., 2016: Estimating Tortuosity Coefficients Based on Hydraulic Conductivity. Groundwater., 54, 476-487.

Carman, P. C., 1997: Fluid flow through granular beds. Process Safety and Environmental Protection: Transactions of the Institution of Chemical Engineers, Part B., 75, S32-S48.

Chen, Z.; Singer, P. M.; Kuang, J.; Vargas, F. M.; Hirasaki, G. J., 2017: Effects of bitumen extraction on the 2D NMR response of saturated kerogen isolates. Petrophysics., 58, 470-484.

Chen, Z., Singer, P. M., Wang, X., Vinegar, H. J., Nguyen, S. V., Hirasaki, G. J., "NMR Evaluation of Light-Hydrocarbon Composition, Pore Size, and Tortuosity in Organic-Rich Chalks", Petrophysics 60 (06), 771-797, 2019a Chen, Z., Singer, P. M., Wang, X., Hirasaki, G. J., Vinegar, H. J., "Evaluation of Light Hydrocarbon Composition, Pore Size, and Tortuosity in Organic-Rich Chalks using NMR Core Analysis and Logging", Society of Petrophysicists and Well-Log Analysts, SPWLA-2019-K, 2019b Chen, Z., Wang, X., Jian, G., Zhang, L., Dong, P., Singer, P. M., & Hirasaki, G. J., 2020. Fast Permeability Estimation of an Unconventional Formation Core by Transient-Pressure History Matching. SPE Journal 2020

Coates G. R., Miller, M., Gillen, M., Henderson, C., "The MRIL in Conoco 33-1 an Investigation of a New Magnetic Resonance Imaging Log", Society of Petrophysicists and Well-Log Analysts, SPWLA-1991-DD, 1991

Dullien, F. A. L., "Porous Media Fluid Transport and Pore Structure", Academic Press, 1979, pp 224-225.

Epstein, N., 1989: On tortuosity and the tortuosity factor in flow and diffusion through porous media. Chemical Engineering Science., 44, 777-779.

Glover, P. W. J., 2016: Archie's law—A reappraisal. Solid Earth., 7, 1157-1169.

Hirasaki, G. J., Rohan, J. A., Dudley, J. W., "Modification of Centrifuge and Software for Determination of Relative Permeability Curves", SPE 25290, August, 1992.

Hirasaki, G. J., Rohan, J. A., Dudley, J. W., "Interpretation of Oil-Water Relative Permeabilities from Centrifuge Experiments". SPE Advanced Technology Series, Vol. 3, No. 1, pp. 66-75, 1995.

Hurlimann, M. D.; Helmer, K. G.; Latour, L. L.; Sotak, C. H., 1994: Restricted Diffusion in Sedimentary Rocks. Determination of Surface-Area-to-Volume Ratio and Surface Relaxivity. Journal of Magnetic Resonance, Series A., 111, 169-178.

Kenyon, W. E., Day, P. I., Straley, C., Willemsen, J. F., "A three-part study of NMR longitudinal relaxation properties of water-saturated sandstones", Society Petroleum Engineers, SPE-15643-PA, 1988

Latour, L. L.; Mitra, P. P.; Kleinberg, R. L.; Sotak, C. H., 1993: Time-Dependent Diffusion Coefficient of Fluids in Porous Media as a Probe of Surface-to-Volume Ratio. Journal of Magnetic Resonance—Series A., 101, 342-346.

Lo, S. W.; Hirasaki, G. J.; House, W. V.; Kobayashi, R., 2002: Mixing rules and correlations of NMR relaxation time with viscosity, diffusivity, and gas/oil ratio of methane/hydrocarbon mixtures. SPE Journal., 7, 24-34.

Mitchell, J.; Gladden, L. F.; Chandrasekera, T. C.; Fordham, E. J., 2014: Low-field permanent magnets for industrial process and quality control. Progress in Nuclear Magnetic Resonance Spectroscopy., 76, 1-60.

Mitra, P. P.; Sen, P. N., 1992: Effects of microgeometry and surface relaxation on NMR pulsed-field-gradient experiments: Simple pore geometries. Physical Review B., 45, 143-156.

Monicard, R. P., 1980: Properties of Reservoir Rocks: Core Analysis. Springer Netherlands.

Muller-Huber, E., Schon, J., Borner, F., "A Pore Body-Pore Throat-Based Capillary Approach for NMR Interpretation in Carbonate Rocks using the Coates Equation", Society of Petrophysicists and Well-Log Analysts 2016

Sander, R.; Pan, Z.; Connell, L. D., 2017: Laboratory measurement of low permeability unconventional gas reservoir rocks: A review of experimental methods. Journal of Natural Gas Science and Engineering., 37, 248-279.

Singer, P.; Chen, Z.; Hirasaki, G., 2016: Fluid Typing and Pore Size in Organic Shale Using 2D NMR in Saturated Kerogen Isolates. Petrophysics., 57, 604-619.

Singer, J. M., Johnston, L., Kleinberg, R. L., Flaum, C., "Fast NMR Logging for Bound Fluid and Permeability", Society of Petrophysicists and Well-Log Analysts, SPWLA-1997-YY, 1997

Souza, A., Carneiro, G., Zielinski, L., Polinski, R., Schwartz, L., Hürlimann, M. D., Boyd, A., Rios, E. H., Camilo dos Santos, B. C., Trevizan, W. A., Machado, F. V., Azeredo, R. B. V., "Permeability Prediction Improvement using 2D NMR Diffusion-T2 Maps", Society of Petrophysicists and Well-Log Analysts, SPW LA-2013-U, 2013

Straley, C., Rossini, D., Vinegar, H. J., Tutunjian, P., Morriss, C., "Core Analysis by Low-field NMR", Society of Petrophysicists and Well-Log Analysts, SPWLA-1997-v38n2a3, 1997

Tanner, J. E., 1970: Use of the stimulated echo in nmr diffusion studies. The Journal of Chemical Physics., 52, 2523-2526.

Timur, R., "Pulsed nuclear magnetic resonance studies of porosity, movable fluid, and permeability of sandstones", Society Petroleum Engineers, SPE-2045-PA, 1969

Venkataramanan, L.; Song, Y. Q.; Hürlimann, M. D., 2002: Solving Fredholm integrals of the first kind with tensor product structure in 2 and 2.5 dimensions. IEEE Transactions on Signal Processing., 50, 1017-1026.

Wang, X., Singer, P. M., Chen, Z., Hirasaki, G. J., Vinegar, H. J., "A New Method of Estimating Tortuosity and Pore Size in Unconventional Formations using NMR Restricted Diffusion Measurements" Society of Petrophysicists and Well-Log Analysts 2020

Wyllie, M. R. J.; Rose, W. D., 1950: Some Theoretical Considerations Related To The Quantitative Evaluation Of The Physical Characteristics Of Reservoir Rock From Electrical Log Data. Journal of Petroleum Technology., 2, 105-118.

Yang, K.; Li, M.; Ling, N. N. A.; May, E. F.; Connolly, P. R. J.; Esteban, L.; Clennell, M. B.; Mahmoud, M.; El- Husseiny, A.; Adebayo, A. R.; Elsayed, M. M.; Johns, M. L., 2019: Quantitative Tortuosity Measurements of Carbonate Rocks Using Pulsed Field Gradient NMR. Transport in Porous Media., 130, 847-865.

Zecca, M.; Vogt, S. J.; Connolly, P. R. J.; May, E. F.; Johns, M. L., 2018: NMR Measurements of Tortuosity in Partially Saturated Porous Media. Transport in Porous Media., 125, 271-288.

Zielinski, L.; Ramamoorthy, R.; Minh, C. C.; Al Daghar, K. A.; Sayed, R. H.; Abdelaal, A. F., 2010: Restricted Diffusion Effects in Saturation Estimates From 2D Diffusion-Relaxation NMR Maps. Society of Petroleum Engineers.

What is claimed is:

1. A method of determining, for each of three different fluid phases (water, oil and gas), a set of one or more fluid-phase-specific petrophysical properties (FPS-PP) of geological core where FPS-PP$_{WATER}$ is the FPS-PP for the water phase, FPS-PP$_{OIL}$ is the FPS-PP for the oil phase, FPS-PP$_{GAS}$ is the FPS-PP for the gas phase, where the FPS-PP is selected from a FPS-PP group which is defined below, the method comprising:
 a. subjecting the geological core to NMR restricted diffusion measurements for multiple NMR active nuclei with at least two different hydrocarbons for at least the oil and gas phases, and
 b. centrifuging the geological core over multiple drainage or imbibition cycles so as to produce effluent from the geological core;
 c. as the geological core is centrifuged, measuring a time dependence of a flow rate of effluent from the geological core;
 d. computing, from results of the NMR restricted diffusion measurements and from the time dependence of the flow rate of effluent, all of (i) FPS-PP$_{WATER}$, (ii) FPS-PP$_{OIL}$ and (iii) FPS-PP$_{GAS}$, wherein the FPS-PP group is defined as the group consisting of: (A) a fluid-phase-specific tortuosity value; (B) a fluid-phase-specific porosity value, the fluid-phase-specific porosity being defined as a fraction of a total pore volume which is occupied by a specific phase (oil, water or gas); (C) a fluid-specific-phase pore diameter, the fluid-specific-phase pore diameter being defined as a pore diameter which is occupied by the specific phase (oil, water, or gas); (D) a fluid-phase-specific body-to-throat ratio, the fluid-phase-specific body-to-throat ratio being defined as a body-to-throat ratio of respective throat and pore volumes which are occupied by the specific phase (oil, water or gas); (E) a fluid-phase-specific permeability, the fluid-phase-specific permeability being defined as the permeability of a specific phase (oil, water, or gas); (F) a fluid-phase-specific relative permeability curve for two specific phases.

2. The method of claim 1 wherein the set of one or more petrophysical properties comprises; (A) 3 phase-specific tortuosity values, one each of the 3 fluid-phases; (B) phase specific pore diameter values, one for each of the 3 fluid-phases where a pore diameter value for a given fluid-phase is defined as the pore diameter occupied by that fluid-phase; (C) fluid-specific-phase body-to-throat ratio, the fluid-specific-phase body-to-throat ratio, one for each of the 3 fluid-phases; (D) fluid-phase-specific porosity values, the fluid-phase-specific porosity being defined as the fraction of total pore volume occupied by the specific phase (oil, water or gas); (E) fluid-phase-specific permeabilities, one for each of the 3 fluid-phases; and (F) fluid-phase-specific relative permeability curves for two specific phases.

3. The method of claim 1 where the NMR restricted diffusion measurements utilize a D-T$_2$ method.

4. The method of claim 3 wherein a Padé fit is used with restricted diffusion data of the NMR restricted diffusion measurements for any fluid phase to determine both a fluid-phase-specific surface-to-volume ratio and the fluid-phase-specific tortuosity value for that fluid phase.

5. The method of claim 1 wherein the multiple NMR active nuclei comprise $^1$H and $^{19}$F.

6. The method of claim 1 wherein the water phase comprises D$_2$O.

7. The method of claim 1 wherein the gas phase is simulated using at least one fluorinated hydrocarbon.

8. The method of claim 7 wherein the gas phase is simulated using Fluorinert FC-770.

9. The method of claim 7 wherein the gas phase is simulated using SF$_6$.

10. The method of claim 7 wherein at least one of the fluorinated hydrocarbons comprises CF$_x$H$_y$Cl$_z$ where x and y and z are integers between 0 and 3.

11. The method of claim 1 wherein the multiple NMR-active nuclei comprise $^{23}$Na and $^2$H.

12. The method of claim 1, further comprising determining one or more locations in accordance with all of FPS-PP$_{WATER}$, FPS-PP$_{OIL}$, and FPS-PP$_{GAS}$, and drilling one or more horizontal or vertical wells in accordance with one or more of the determined locations.

13. The method of claim 1, further comprising determining one or more locations in accordance with all of FPS-PP$_{WATER}$, FPS-PP$_{OIL}$, and FPS-PP$_{GAS}$, and performing at least one additional operation in accordance with one or more of the determined locations, wherein the at least one additional operation includes at least one of: (i) caping and perforating; and (ii) deploying a pump.

* * * * *